US008143171B2

United States Patent
Mashita et al.

(10) Patent No.: US 8,143,171 B2
(45) Date of Patent: Mar. 27, 2012

(54) METHOD FOR MANUFACTURING SEMICONDUCTOR DEVICE AND COMPUTER READABLE MEDIUM FOR STORING PATTERN SIZE SETTING PROGRAM

(75) Inventors: Hiromitsu Mashita, Kanagawa (JP); Toshiya Kotani, Tokyo (JP); Fumiharu Nakajima, Kanagawa (JP); Takafumi Taguchi, Kanagawa (JP); Chikaaki Kodama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 412 days.

(21) Appl. No.: 12/403,740

(22) Filed: Mar. 13, 2009

(65) Prior Publication Data
US 2009/0258503 A1 Oct. 15, 2009

(30) Foreign Application Priority Data
Apr. 14, 2008 (JP) .................. 2008-104550

(51) Int. Cl.
*H01L 21/461* (2006.01)
(52) U.S. Cl. ........................ 438/736; 438/745

(58) Field of Classification Search .................. None
See application file for complete search history.

(56) References Cited

U.S. PATENT DOCUMENTS

| 5,328,810 | A  | * | 7/1994  | Lowrey et al. .............. 430/313 |
| 6,383,952 | B1 |   | 5/2002  | Subramanian et al. |
| 6,475,891 | B2 |   | 11/2002 | Moon |
| 2008/0090419 | A1 | | 4/2008  | Koh et al. |

OTHER PUBLICATIONS

Yen eta I, Photo-resist trimming for sub 0.1 um generation integrated circuit devicesby Cl2/O2 transform coupled plasma, 2004, microelectronic engineering, p. 201-209.*

* cited by examiner

*Primary Examiner* — Binh X Tran
*Assistant Examiner* — David Cathey, Jr.
(74) *Attorney, Agent, or Firm* — Finnegan, Henderson, Farabow, Garrett & Dunner, L.L.P.

(57) ABSTRACT

A method of manufacturing a semiconductor device, which forms a pattern by performing pattern transformation steps multiple times, comprises setting finished pattern sizes for patterns to be formed in each consecutive two pattern transformation steps among the plurality of pattern transformation steps based on a possible total amount of in-plane size variation of the patterns to be formed in the consecutive two pattern transformation steps.

6 Claims, 9 Drawing Sheets

METHOD FOR MANUFACTURING SEMICONDUCTOR DEVICE AND COMPUTER READABLE MEDIUM FOR STORING PATTERN SIZE SETTING PROGRAM

CROSS-REFERENCE TO RELATED APPLICATIONS

This application is based upon and claims the benefit of priority from the prior Japanese Patent Application No. 2008-104550, filed on Apr. 14, 2008; the entire contents of which are incorporated herein by reference.

BACKGROUND OF THE INVENTION

1. Field of the Invention

The present invention relates to a method of manufacturing a semiconductor device which forms a pattern by performing pattern transformation steps multiple times, and relates to a computer readable medium for storing a pattern size setting program capable of setting optimum size for each pattern formed in each pattern transformation step.

2. Description of the Related Art

In the development of a semiconductor integrated circuit, downsizing of a pattern has been progressing year by year. Such progress of pattern downsizing has depended on a photolithography technique, and the trend of pattern downsizing is likely to continue for some years. The pattern size in photolithography (i.e. half pitch (HP)) can be represented by the following Rayleigh formula based on a wavelength ($\lambda$) of an exposure device used in achieving that pattern size and the number of lens apertures (NA).

$$HP = k_1 \times \lambda / NA$$

If a pattern pitch is to be determined by the needs in the market, a factor $k_1$ in this formula will show a degree of difficulty in achieving such pattern pitch. The factor $k_1$ will be a process constant which is determined mainly based on resist performance, device controllability, a pattern of a reticle, and process controllability. Accordingly, in the above formula, it can be understood that lithography is difficult when the factor $k_1$ is small.

Due to the progress of downsizing in a semiconductor device in recent years, a pattern size with a factor $k_1$ that is less than 0.25, which is a theoretical limit in lithography, has been required. In a level with such pattern size, a method of forming a pattern pitch which is smaller than a minimum pattern pitch capable of being formed by lithography is required. Conventionally, as one of such methods, a downsizing processing method using a sidewall process has been proposed (e.g. U.S. Pat. No. 6,383,952, U.S. Pat. No. 6,475,891).

Now, one example of the conventional downsizing processing method using the sidewall process will be described. In this example, first, a sacrifice film is stacked on a process target layer, which may be a substrate, etc., after which the sacrifice film is patterned through a lithography step and a processing step. Then, a sidewall material is deposited on the sacrifice film to a desired thickness, after which the sidewall material formed in a part of the sacrifice film pattern other than a sidewall portion is removed, and then the sacrifice film is removed in a way leaving the sidewall portion of the sacrifice film pattern. Then, by performing an etching process using this sidewall portion as a mask, the process target layer is formed into a desired pattern.

However, the above-described conventional sidewall process requires processing of the sacrifice film; deposition of the sidewall material; removal of a part of the sidewall material; removal of the sacrifice film; etching process using the sidewall portion as the mask; and the like, which are more complicated process steps than in the conventional process where the process target layer is patterned using a resist pattern as a mask. Therefore, variation in size of each pattern as formed in each process step accumulates to cause a problem in that the size of the pattern eventually formed in the process target layer will vary greatly depending on the position of the pattern within the element formation surface. For example, in a case when the sidewall process is adopted in wiring pattern formation and when a size of a pattern is varied considerably, inter-wiring capacitance will become large, and as a result, a circuit operation speed will decrease. Moreover, in a case when the sidewall process is adopted in gate pattern formation, possible variations in a line size may cause short-channel of a transistor whereby a malfunction of the transistor can be caused, or long-channel of a transistor whereby a circuit speed can be decreased as a current value becomes insufficient.

BRIEF SUMMARY OF THE INVENTION

A method of manufacturing a semiconductor device, which forms a pattern by performing pattern transformation steps multiple times, comprises setting finished pattern sizes for patterns to be formed in each consecutive two pattern transformation steps among the plurality of pattern transformation steps based on a possible total amount of in-plane size variation of the patterns to be formed in the consecutive two pattern transformation steps.

A method of manufacturing a semiconductor device, which forms a pattern by performing pattern transformation steps multiple times, comprises setting a finished pattern size for a pattern to be formed in a latter pattern transformation step in consecutive two pattern transformation steps among the plurality of pattern transformation steps based on a relation between an amount of in-plane size variation of a pattern which is formed in a former pattern transformation step in the consecutive two pattern transformation steps and an amount of in-plane size variation of a pattern which is formed in the latter pattern transformation step.

A computer readable medium for storing a pattern size setting program, which sets a size of a pattern formed through multiple pattern transformation steps, comprises instructions for setting finished pattern sizes for patterns to be formed in each consecutive two pattern transformation steps among the plurality of pattern transformation steps based on a possible total amount of in-plane size variation of the patterns to be formed in the consecutive two pattern transformation steps.

DETAILED DESCRIPTION OF THE INVENTION

An exemplary embodiment of a method of manufacturing a semiconductor device and a computer readable medium for storing a pattern size setting program according to the present invention will be explained below in detail with reference to the accompanying drawings. The present invention is not limited to the following embodiment. Furthermore, it is to be understood that sectional views of the semiconductor device used in describing the following embodiment are given for illustrative purposes, and therefore, relations among thicknesses and widths of layers, ratio of thicknesses of layers, etc. are different from what they actually are in practice. Moreover, the thicknesses of layers as will be shown in the following embodiments are examples, and therefore, the actual thicknesses of layers are not to be limited by such examples.

Figure 1:
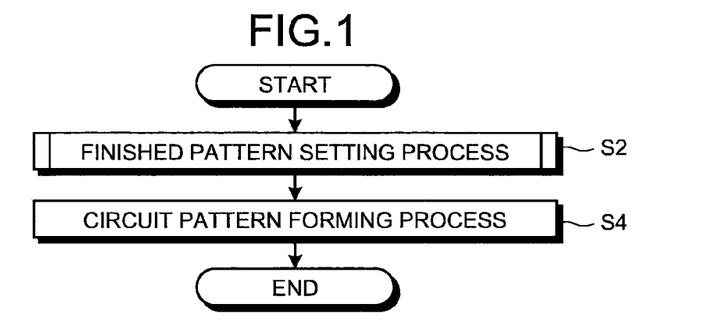
FIG. 1 is a diagram showing process steps in a method of manufacturing a semiconductor device according to an embodiment of the present invention.

FIG. 1 is a diagram showing process steps in the method of manufacturing a semiconductor device according to the embodiment of the present invention. As shown in FIG. 1, in the method of manufacturing a semiconductor device according to the present embodiment, a semiconductor device is manufactured through a finished pattern setting process (step S2) and a circuit pattern forming process (step S4). In the finished pattern setting process (S2), a finished size of a circuit pattern of each circuit that constructs the semiconductor device is set. Then, in the circuit pattern forming process, a sidewall process is used in actually forming each pattern such that the finished size as set in the finished pattern setting process can be accomplished. In the sidewall process according to the present embodiment, pattern transformation steps for processing a process target layer or a material film on the process target layer into respective predetermined patterns including a sidewall portion are performed multiple times in order to form the process target layer into a final target pattern.

Figure 2A:
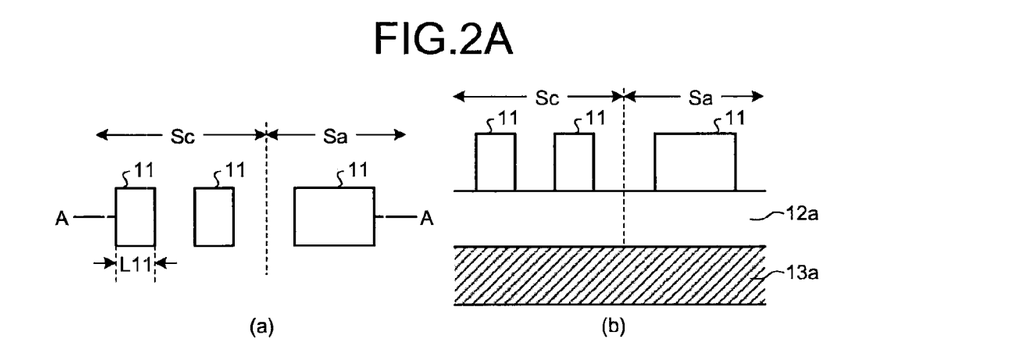
FIG. 2A illustrates a schematic plane view and a schematic sectional view (Phase 1) showing one example of pattern transformation steps as performed in a circuit pattern formation step.

Now, respective steps in the sidewall process will be described. To begin with, one example of the sidewall process will be described with reference to FIG. 2A to FIG. 2F. FIG. 2A to FIG. 2F are diagrams showing one example of the pattern transformation steps as performed in a circuit pattern formation step; FIG. 2A (a) to FIG. 2F (a) are plain views showing one example of the patterns as formed in respective pattern transformation steps. FIG. 2A (b) to FIG. 2F (b) are sectional views of FIG. 2A (a) to FIG. 2F (a) taken along a line A-A. In each of FIG. 2A to FIG. 2F, patterns formed in both a cell region Sc and a peripheral circuit region Sa are shown.

In the sidewall process, first, a hardmask layer (a first sacrifice film) to be functioning as a sacrifice film is formed on a process target layer, which is to be eventually formed into a final target pattern, after which a resist solution is applied on the hardmask layer. The hardmask layer, for example, is formed with polysilicon, amorphous silicon, or the like. After that, a first pattern transformation step where a mask pattern is printed on the resist film, having been applied on the hardmask layer, by a lithography process is performed, whereby a resist pattern 11 is formed on a hardmask layer 12a having been formed on a process target layer 13a, as shown in FIG. 2A. Here, the hardmask layer 12a can be a laminated film (e.g. a laminated film including an antireflection film containing carbon and an SOG film) where a plurality of films are stacked. A total size of line-and-space (i.e. pitch) in the resist pattern 11 formed in the first pattern transformation step is set to be twice a total size of line-and-space (i.e. pitch) in the final target pattern.

Figure 2B:
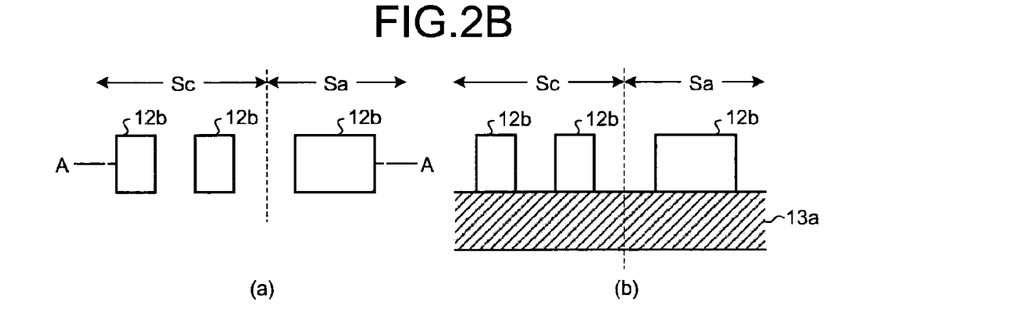
FIG. 2B illustrates a schematic plane view and a schematic sectional view (Phase 2) showing one example of the pattern transformation steps as performed in the circuit pattern formation step.

Then, a second pattern formation step where the hardmask layer 12a is processed into a hardmask pattern 12b, which is formed with the same material film as the hardmask layer 12a, by selectively etching the hardmask layer 12a using the resist pattern 11 as a mask is performed, as shown in FIG. 2B. The resist pattern 11 is to be removed after the hardmask pattern 12b is formed.

Figure 2C:
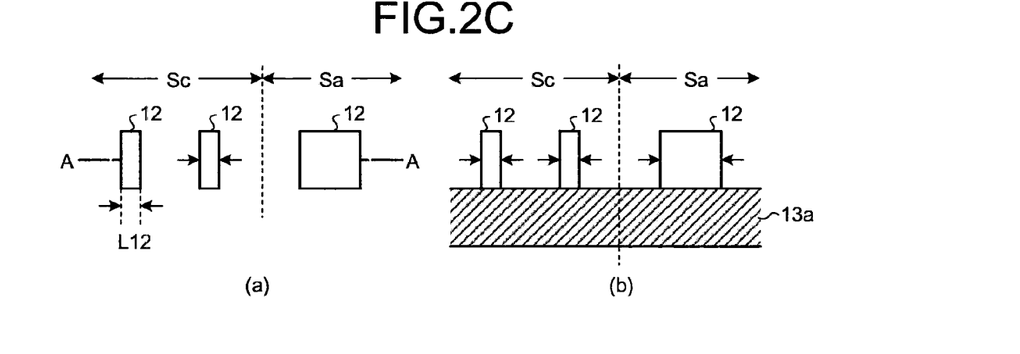
FIG. 2C illustrates a schematic plane view and a schematic sectional view (Phase 3) showing one example of the pattern transformation steps as performed in the circuit pattern formation step.

Then, a third pattern formation step where the hardmask pattern 12b is processed into a hardmask pattern 12, which size is reduced to a predetermined size, by slimming the hardmask pattern 12b using wet etching process, or the like, is performed, as shown in FIG. 2C. This hardmask pattern 12 is formed with the material film that constructs the hardmask film 12a. In this third pattern transformation step, the hardmask pattern 12b is slimmed down, for example, to become approximately half the size.

Figure 2D:
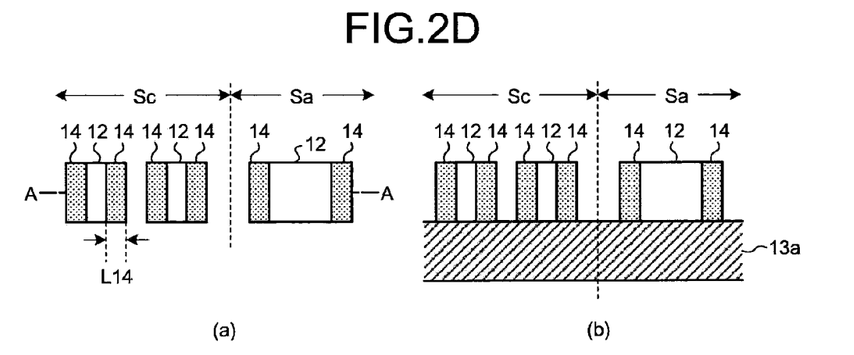
FIG. 2D illustrates a schematic plane view and a schematic sectional view (Phase 4) showing one example of the pattern transformation steps as performed in the circuit pattern formation step.

Then, a film, which is to be processed into a sidewall pattern, is formed on the process target layer 13a and on the entire surface of the hardmask pattern 12. This film which is to be processed into a sidewall pattern can be a SiN film, for instance. This film, however, is not limited to being a SiN film. It is appropriate as long as the film is formed with a material that can keep a sufficient etching selectivity with the hardmask pattern 12. After that, as shown in FIG. 2D, a sidewall pattern 14 with a pattern size L14 is formed by an etching process such as RIE which is capable of processing the film in such a way as to have a sidewall material at a sidewall portion of the hardmask pattern 12 remain. In this description, the step of forming the sidewall pattern 14 at the sidewall portion of the hardmask pattern 12 will be regarded as a fourth pattern transformation step.

Figure 2E:
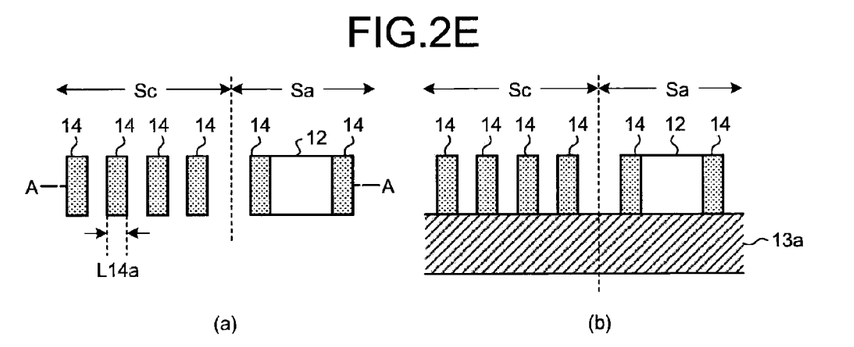
FIG. 2E illustrates a schematic plane view and a schematic sectional view (Phase 5) showing one example of the pattern transformation steps as performed in the circuit pattern formation step.

Then, as shown in FIG. 2E, the hardmask pattern 12 is removed. In this case, a requested pattern size at the peripheral circuit region Sa is larger than a pattern size L14a at the cell region Sc. So, in order to let the hardmask pattern 12 in the peripheral circuit region Sa remain, the hardmask pattern removing step is performed while having the peripheral circuit region Sa covered with a protection film. As a result, the hardmask pattern 12 in the cell region Sc can be removed, whereas the hardmask pattern 12 in the peripheral region Sa can remain along with the sidewall pattern 14.

Figure 2F:
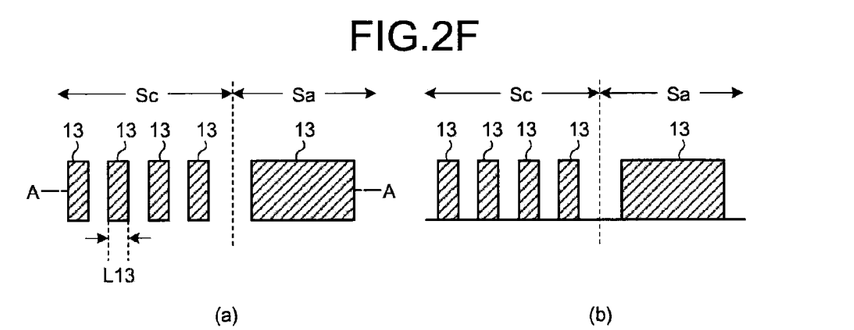
FIG. 2F illustrates a schematic plane view and a schematic sectional view (Phase 6) showing one example of the pattern transformation steps as performed in the circuit pattern formation step.

After that, the process target layer 13a is selectively etched while using the remaining sidewall pattern 14 as a mask. Thus, a fifth pattern transformation step for forming the process target layer 13a into a final pattern 13 is performed, whereby the final target pattern 13 with a pattern size L13 is formed as shown in FIG. 2F.

In each of the above-described steps of the sidewall process, in-plane size variation will appear with respect to a size of the pattern as formed in each of the steps. Each of FIG. 3A to FIG. 3G is a diagram showing an amount of in-plane size variation in each pattern when pattern forming conditions set for each of the pattern transformation steps shown by FIG. 2A to FIG. 2F are changed. The pattern forming conditions, for example, include a resist pattern design (target) size, a processing transformation difference and an amount of slimming of hardmask, an amount of deposition and/or size of sidewall pattern, a processing transformation difference of process target layer, and so forth. As shown by a curve R11 in FIG. 3A, in a case when a designed line-and-space pattern size (HP11) of the resist pattern 11 is changed, an amount of in-plane size variation in the resist pattern 11 becomes larger as a pitch between a line and a space in the resist pattern 11 becomes larger. Furthermore, as shown by a curve Rd12 in FIG. 3B, an amount of in-plane size variation in the hardmask pattern 12b becomes larger as an absolute value of a processing transformation difference between the resist pattern 11 and the hardmask pattern 12b becomes larger. Moreover, as shown by a curve R12 in FIG. 3C, an amount of in-plane size variation in the hardmask pattern 12 becomes large when an amount of slimming of the hardmask pattern 12b becomes large or small. Furthermore, as shown by a curve R14 in FIG. 3D, an amount of in-plane size variation of a pattern size in the sidewall pattern 14 becomes large when an amount of deposition or volume of the sidewall film becomes small. Moreover, as shown by a curve R14a in FIG. 3E, an amount of in-plane size variation of a pattern size in the sidewall pattern 14 after the removal of the hardmask pattern 12 becomes large when a sidewall pattern size becomes large or small. Then, as shown by a curve Rd13 in FIG. 3F, an amount of in-plane size variation of the finished pattern 13 becomes larger as an absolute value of a processing transformation difference in the process of transforming the sidewall pattern 14 into the final pattern 13 becomes larger. The in-plane size variation of the size of the pattern formed in each of the processing steps can be derived through experiments or simulations. Thus, in the present embodiment, a relation between the pattern formation conditions for each of the processing steps and the amount of in-plane size variation of the pattern to be formed under such pattern formation conditions is to be derived in advance.

In the sidewall process, first, a hardmask layer (a first sacrifice film) to be functioning as a sacrifice film is formed on a process target layer, which is to be eventually formed into a final target pattern, after which a resist solution is applied on the hardmask layer. The hardmask layer, for example, is formed with polysilicon, amorphous silicon, or the like. After that, a first pattern transformation step where a mask pattern is printed on the resist film, having been applied on the hardmask layer, by a lithography process is performed, whereby a resist pattern 11 is formed on a hardmask layer 12a having been formed on a process target layer 13a, as shown in FIG. 2-1. Here, the hardmask layer 12a can be a laminated film (e.g. a laminated film including an antireflection film containing carbon and an SOG film) where a plurality of films are stacked. A total size of line-and-space (i.e. pitch) in the resist pattern 11 formed in the first pattern transformation step is set to be twice a total size of line-and-space (i.e. pitch) in the final target pattern.

Then, a second pattern formation step where the hardmask layer 12a is processed into a hardmask pattern 12b, which is formed with the same material film as the hardmask layer 12a, by selectively etching the hardmask layer 12a using the resist pattern 11 as a mask is performed, as shown in FIG. 2-2. The resist pattern 11 is to be removed after the hardmask patter 12b is formed.

Then, a third pattern formation step where the hardmask pattern 12b is processed into a hardmask pattern 12, which size is reduced to a predetermined size, by slimming the hardmask pattern 12b using wet etching process, or the like, is performed, as shown in FIG. 2-3. This hardmask pattern 12 is formed with the material film that constructs the hardmask film 12a. In this third pattern transformation step, the hardmask pattern 12b is slimed down, for example, to become approximately half the size.

Then, a film, which is to be processed into a sidewall pattern, is formed on the process target layer 13a and on the entire surface of the hardmask pattern 12. This film which is to be processed into a sidewall pattern can be a SiN film, for instance. This film, however, is not limited to being a SiN film. It is appropriate as long as the film is formed with a material that can keep a sufficient etching selectivity with the hardmask pattern 12. After that, as shown in FIG. 2-4, a sidewall pattern 14 with a pattern size L14 is formed by an etching process such as RIE which is capable of processing the film in such a way as to have a sidewall material at a sidewall portion of the hardmask pattern 12 remain. In this description, the step of forming the sidewall pattern 14 at the sidewall portion of the hardmask pattern 12 will be regarded as a fourth pattern transformation step.

Then, as shown in FIG. 2-5, the hardmask pattern 12 is removed. In this case, a requested pattern size at the peripheral circuit region Sa is larger than a pattern size L14a at the cell region Sc. So, in order to let the hardmask pattern 12 in the peripheral circuit region Sa remain, the hardmask pattern removing step is performed while having the peripheral circuit region Sa covered with a protection film. As a result, the hardmask pattern 12 in the cell region Sc can be removed, whereas the hardmask pattern 12 in the peripheral region Sa can remain along with the sidewall pattern 14.

After that, the process target layer 13a is selectively etched while using the remaining sidewall pattern 14 as a mask. Thus, a fifth pattern transformation step for forming the process target layer 13a into a final pattern 13 is performed, whereby the final target pattern 13 with a pattern size L13 is formed as shown in FIG. 2-6.

In each of the above-described steps of the sidewall process, in-plane size variation will appear with respect to a size of the pattern as formed in each of the steps. Each of FIG. 3A to FIG. 3G is a diagram showing an amount of in-plane size variation in each pattern when pattern forming conditions set for each of the pattern transformation steps shown by FIG. 2-1 to FIG. 2-6 are changed. The pattern forming conditions, for example, include a resist pattern design (target) size, a processing transformation difference and an amount of slimming of hardmask, an amount of deposition and/or size of sidewall pattern, a processing transformation difference of process target layer, and so forth. As shown by a curve R11 in FIG. 3A, in a case when a designed line-and-space pattern size (HP11) of the resist pattern 11 is changed, an amount of in-plane size variation in the resist pattern 11 becomes larger as a pitch between a line and a space in the resist pattern 11 becomes larger. Furthermore, as shown by a curve Rd12 in FIG. 3B, an amount of in-plane size variation in the hardmask pattern 12b becomes larger as an absolute value of a processing transformation difference between the resist pattern 11 and the hardmask pattern 12b becomes larger. Moreover, as shown by a curve R12 in FIG. 3C, an amount of in-plane size variation in the hardmask pattern 12 becomes large when an amount of slimming of the hardmask pattern 12b becomes large or small. Furthermore, as shown by a curve R14 in FIG. 3D, an amount of in-plane size variation of a pattern size in the sidewall pattern 14 becomes large when an amount of deposition or volume of the sidewall film becomes small. Moreover, as shown by a curve R14a in FIG. 3E, an amount of in-plane size variation of a pattern size in the sidewall pattern 14 after the removal of the hardmask pattern 12 becomes large when a sidewall pattern size becomes large or small. Then, as shown by a curve Rd13 in FIG. 3F, an amount of in-plane size variation of the finished pattern 13 becomes larger as an absolute value of a processing transformation difference in the process of transforming the sidewall pattern 14 into the final pattern 13 becomes larger. The in-plane size variation of the size of the pattern formed in each of the processing steps can be derived through experiments or simulations. Thus, in the present embodiment, a relation between the pattern formation conditions for each of the processing steps and the amount of in-plane size variation of the pattern to be formed under such pattern formation conditions is to be derived in advance.

In the conventional sidewall process, processing conditions for each of the processing steps are set such that each pattern to be formed in each step will have a size adjusted to the size of the final pattern 13 being a target. For example, in a case when a pitch of the final pattern 13 is to become half the pitch of the resist pattern 11, the lithography conditions are set such that a pattern size of the resist pattern 11 becomes a size RO11 (cf. FIG. 3A) which is a doubled size of the final pattern size HP. Moreover, it is adjusted such that a processing transformation difference in transforming the resist pattern 11 into the hardmask pattern 12b becomes '0' (cf. FIG. 3B). Furthermore, an amount of slimming with respect to the hardmask pattern 12b is set such that a pattern size becomes a size RO12 (cf. FIG. 3C) which is the same as the final pattern size HP. Moreover, a pattern size of the sidewall pattern 14 is set to a size RO14 (cf. FIG. 3D and FIG. 3E) which is the same as the final pattern size HP. In addition, it is adjusted such that a processing transformation difference in transforming the sidewall pattern 14 into the final pattern 13 becomes '0' (cf. FIG. 3F). Through such conditions, in the conventional sidewall process, the size of the final pattern is adjusted to the target size.

That is, in the conventional sidewall process, processing conditions for each of the processing steps are set such that each pattern to be formed in each step will have a size adjusted to the size of the final pattern 13 being a target. Accordingly, no concern has been given particularly strict about the possible in-plane size variation. However, the conventional sidewall process requires complicated processing such as processing of the sacrifice film; deposition of the sidewall material; removal of the sidewall material; removal of the sacrifice film; etching process using the sidewall portion as the mask; and the like. Therefore, the amount of in-plane size variation in each pattern formed at each pattern transformation step builds up to eventually bring about a large amount of in-plane size variation in the pattern finally formed in the process target layer.

On the contrary, according to the present embodiment, it is not only that processing conditions for each of the pattern transformation steps is set such that a pattern size of each pattern to be formed in each step can be adjusted to the size of the final pattern 13 being a target, but a size of the finished pattern formed in each pattern transformation step is set by having the pattern formation conditions for each pattern transformation step set appropriately such that the amount of in-plane size variation of the final pattern 13 to be eventually formed in the process target layer will become small. Thereby, according to the present embodiment, it is possible to prevent possible in-plane size variation with respect to the final pattern.

Figure 4:
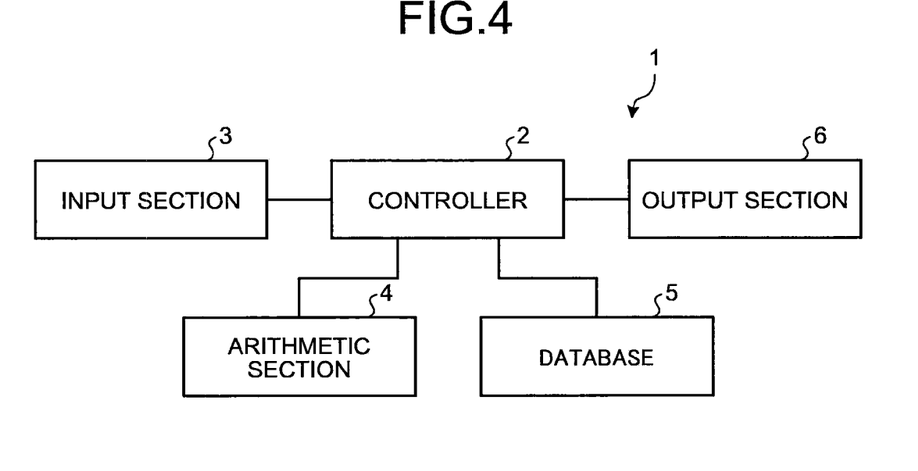
FIG. 4 is a block diagram showing a structure of a size setting device according to the embodiment of the present invention.

Now, a size setting apparatus for setting a finished pattern size for each pattern used in the pattern setting process shown in FIG. 1 will be described. FIG. 4 is a block diagram showing a structure of the size setting apparatus which sets a finished pattern size for each pattern. A size setting apparatus 1 shown in FIG. 4, when used in the method of manufacturing a semiconductor device which forms a pattern by performing multiple pattern transformation steps, sets finished pattern sizes for patterns to be formed in each consecutive two pattern transformation steps among the plurality of pattern transformation steps based on a possible total amount of in-plane size variation of the patterns to be formed in the consecutive two pattern transformation steps. The possible total amount of in-plane size variation of the patterns to be formed in the consecutive two pattern transformation steps can be derived based on a relationship between the pattern formation conditions for each of the consecutive two pattern transformation steps and an amount of in-plane size variation of the pattern to be formed under such pattern formation conditions.

As shown in FIG. 4, the size setting apparatus 1 has a controller 2, an input section 3, an arithmetic section 4, a database 5 and an output section 6. The controller 2 is configured as including a CPU, a memory, etc., and controls operation and process of each section in the size setting apparatus 1. The controller 2 performs predetermined input/output control on information inputted/outputted to/from each structure member, and further performs predetermined information processing on such information. The input section 3 is configured as including a keyboard, mouse, etc., and obtains various information necessary in setting a finished pattern size for each pattern, instruction information with respect to a setting process operation, etc. from outside.

The arithmetic section 4 obtains a total amount of possible in-plane size variation from the whole pattern transformation steps through performing a simulation process or an information search process on the information in the data base 5, based on a possible amount of in-plane size variation of the pattern as formed in each of the pattern transformation steps in a case when the pattern formation conditions for each of the pattern transformation steps are changed. Then, based on the obtained total amount of possible in-plane size variation, the arithmetic section 4 sets the finished pattern size for each pattern to be formed in each pattern transformation step. The amount of possible in-plane size variation of each pattern as formed in each pattern transformation step is inputted to the size setting apparatus 1 via the input section 3, for example, and then to the arithmetic section 4. However, the present embodiment is not limited to such arrangement, as will be described below.

The database 5 is configured as including a hard disc, etc., a hard disc functioning to magnetically store information. The database 5 stores various information necessary in setting the finished pattern size for each pattern. The output section 6 is configured as including a display, a printer, a speaker, etc., and functions to output various information including results of analyses on samples. Furthermore, the output section 6 outputs various information to an external device through a communication network, which is not shown.

Figure 5:
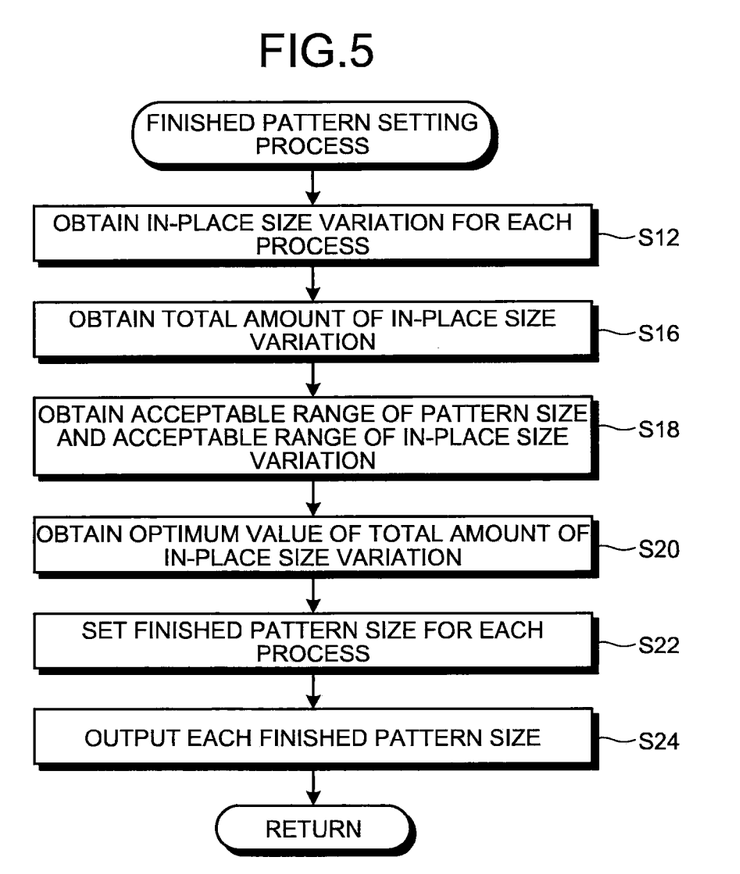
FIG. 5 is a flow chart showing respective process procedures in a finished pattern setting process shown in FIG. 1.

Next, the finished pattern setting process shown in FIG. 1 will be described. FIG. 5 is a flow chart showing respective process procedures in the finished pattern setting process performed by the size setting apparatus 1 shown in FIG. 4. In the following, the description will be given focusing on an operation by the arithmetic section 4.

As shown in FIG. 5, in the finished pattern setting process, the arithmetic section 4 first obtains information on the relation between the pattern formation conditions and the amount of in-plane size variation with respect to each of the pattern transformation steps (step S12). That is, the arithmetic section 4 obtains possible in-plane size variation distributions in the respective steps as illustrated by the curves R11, Rd12, R12, R14, R14a and Rd13 in FIG. 3A to FIG. 3F, for example. Meanwhile, the arithmetic section 4 can obtain the possible in-plane variation distributions in the respective steps, in a form of experiment results from the input section 3; through performing a simulation process; or from the data base 5 or the communication network, which is not shown.

Then, based on the obtained information on the relation between the pattern formation conditions and the amount of in-plane size variation with respect to each of the pattern transformation steps, the arithmetic section 4 obtains a possible distribution of a total amount of in-plane size variation with respect to the entire pattern transformation steps (step S16).

That is, the arithmetic section 4 cumulates the respective amounts of in-plane size variation as illustrated by the curves R11, Rd12, R12, R14, R14a and Rd13 in order to obtain the possible distribution of the total amount of in-plane size variation (hereinafter to be referred to simply as total amount) with respect to the entire pattern transformation steps as shown by a curve Rt in FIG. 3G.

Then, the arithmetic section 4 obtains an acceptable range of in-plane size variation with which an acceptable range of pattern size and a desired yield ratio set based on a lithography margin can be achieved.

Figure 6:
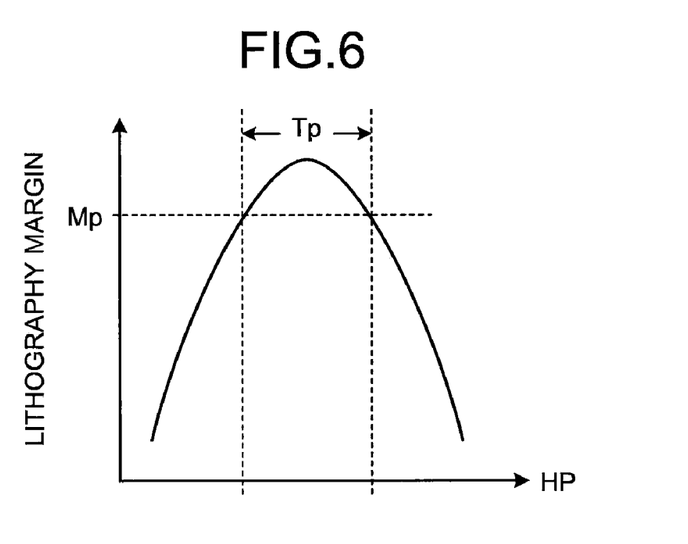
FIG. 6 is a relationship diagram showing a relationship between a lithography margin and a pattern size (HP)
Figure 7:
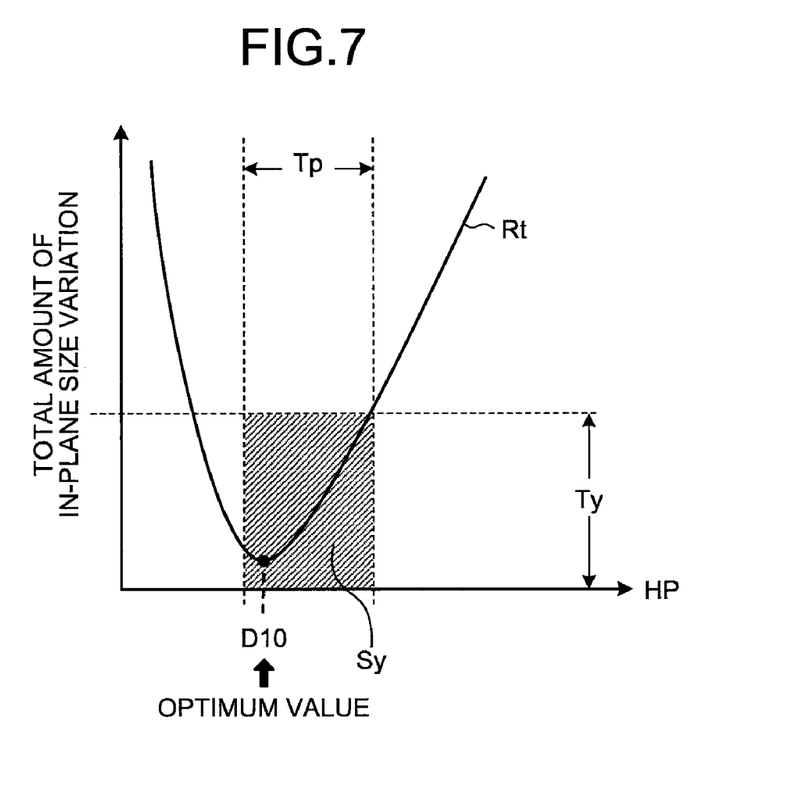
FIG. 7 is a diagram explaining an optimum value setting process with respect to a total amount of in-plane variation shown in FIG. 5.

Now, the lithography margin and the acceptable range of in-plane size variation will be described. FIG. 6 is a relationship diagram with respect to a relationship between the lithography margin and the pattern size (HP). FIG. 7 is a diagram explaining an optimum value setting process with respect to the total amount of in-plane variation, shown in FIG. 5. A lithography margin can be defined as an exposure amount to be actually used in a lithography process. Accordingly, under lithography conditions with an insufficient lithography margin, the lithography process cannot be performed appropriately. In this respect, a pattern size needs to be set in such a way that a lithography margin sufficient for enabling the lithography process can be achieved. For example, if the lithography margin that can enable the lithography process is equal to or grater than Mp shown in FIG. 6, a range Tp shown in FIG. 6 will be set as an acceptable range of pattern size. Then, as shown in FIG. 7, considering that an acceptable range of in-plane size variation calculated based on a desired yield ratio is represented as a range Ty, a range Sy that covers both the range Ty, which enables achievement of the desired yield ratio, and the range Tp, which is the acceptable range of pattern size shown in FIG. 6 as being set based on the lithography margin, will be an acceptable range to be derived at step S18. This acceptable range Sy is obtained by the calculation section 4 from the information stored in the database 5, from the information inputted from the input section 3, from calculation results achieved through a simulation process, or the like.

Then, the arithmetic section 4 obtains an optimum value for the amount of in-plane size variation based on the total amount of in-plane size variation that covers both the obtained acceptable range of pattern size and the acceptable range of in-plane variation (step S20). Here, in a case when a pitch of the final pattern 13 is to become half the pitch of the resist pattern 11, and to become the desired pattern size (HP), a relationship among the pattern formation conditions for the respective pattern transformation steps, which are: (A) a size of the resist pattern 11; (B) an amount of slimming with respect to the hardmask pattern 12b; (C) a pattern size of the sidewall pattern 14; and (D) a processing transformation difference in the process of transforming the sidewall pattern 14 into the final pattern 13, needs to fulfill the following formulas (1) to (3).

$$A-B+C=HP\times 2 \quad (1)$$

$$C+D=HP \quad (2)$$

$$A-B-D=HP \quad (3)$$

Accordingly, based on the acceptable range of pattern size having been set based on the obtained lithography margin, and to the acceptable range of in-plane size variation that enables the desired yield ratio to be achieved, the arithmetic section 4 derives a total amount of in-plane size variation with respect to each of the pattern formation conditions that meets the conditions of formulas (1) to (3). Then, from among the respective total amounts of in-plane size variation derived, the arithmetic section 4 obtains the one with the smallest value as an optimum value for the total amount of in-plane size variation. In the case illustrated in FIG. 7, the arithmetic section 4 obtains a total amount value R10 from among the values of total amount of in-plane size variation in the range Sy as an optimum value for the total amount of in-plane variation.

Next, the arithmetic section 4 sets the pattern formation conditions and the finished pattern size for each of the pattern transformation steps so that the value for the total amount of in-plane size variation is adjusted to the optimum value R10 (step S22). For example, as shown in FIG. 3G, when the optimum value for the total amount of in-plane size variation is the optimum value R10, the pattern size corresponding to the optimum value R10 is set as a finished pattern size of a pattern to be formed in each of the pattern transformation steps.

Figure 3A:
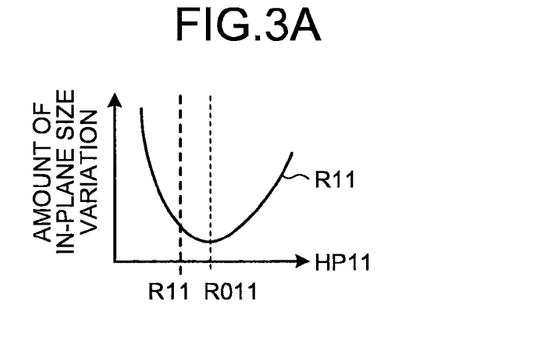
FIG. 3A is a diagram showing an amount of in-plane size variation (Version 1) when a size of each pattern formed in each of the pattern transformation steps shown by FIG. 2A to FIG. 2F is changed.
Figure 3B:
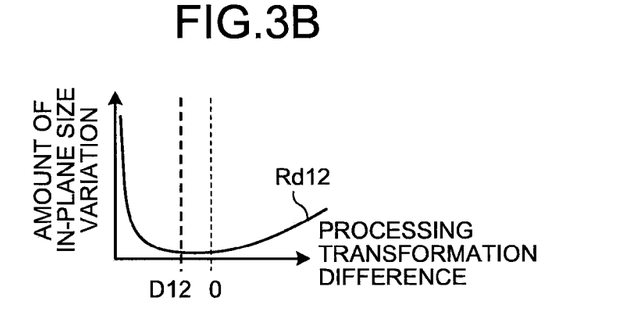
FIG. 3B is a diagram showing an amount of in-plane size variation (Version 2) when a size of each pattern formed in each of the pattern transformation steps shown by FIG. 2A to FIG. 2F is changed.
Figure 3C:
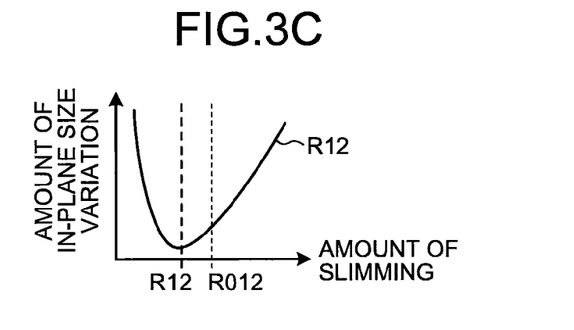
FIG. 3C is a diagram showing an amount of in-plane size variation (Version 3) when a size of each pattern formed in each of the pattern transformation steps shown by FIG. 2A to FIG. 2F is changed.
Figure 3D:
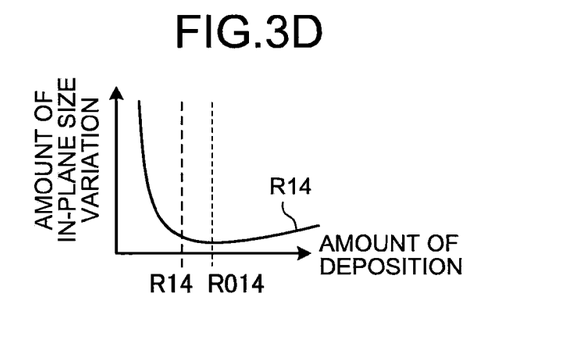
FIG. 3D is a diagram showing an amount of in-plane size variation (Version 4) when a size of each pattern formed in each of the pattern transformation steps shown by FIG. 2A to FIG. 2F is changed.
Figure 3E:
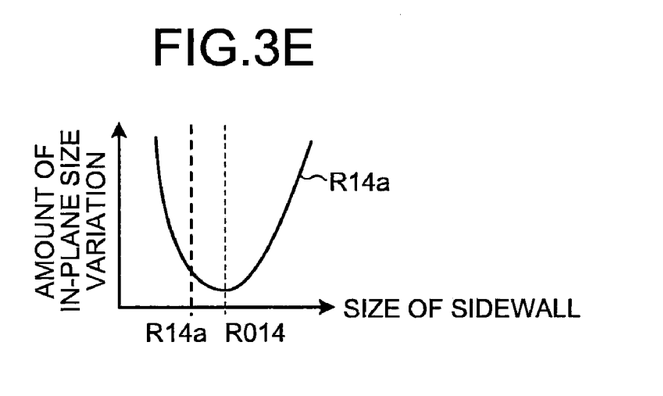
FIG. 3E is a diagram showing an amount of in-plane size variation (Version 5) when a size of each pattern formed in each of the pattern transformation steps shown by FIG. 2A to FIG. 2F is changed.
Figure 3F:
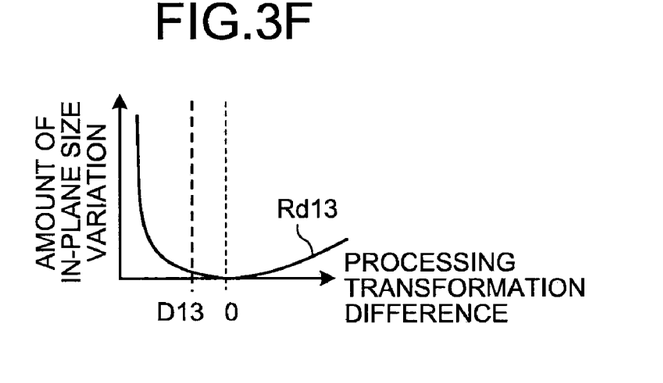
FIG. 3F is a diagram showing an amount of in-plane size variation (Version 6) when a size of each pattern formed in each of the pattern transformation steps shown by FIG. 2A to FIG. 2F is changed.
Figure 3G:
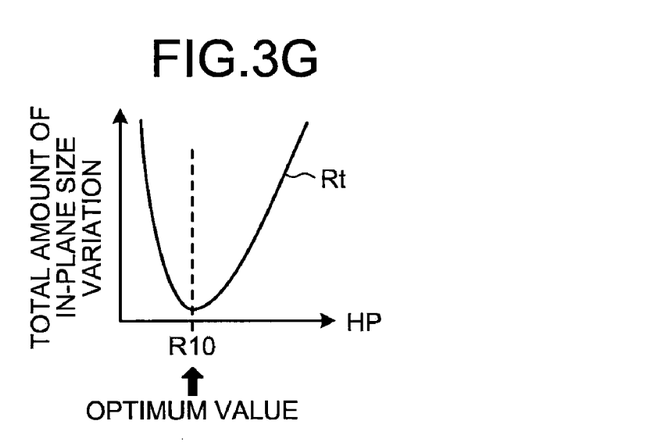
FIG. 3G is a diagram showing an amount of in-plane size variation (Version 7) when a size of each pattern formed in each of the pattern transformation steps shown by FIG. 2A to FIG. 2F is changed.

That is, a finished pattern size of the resist pattern 11 to be formed in the first pattern transformation step is set to the size R11, as shown in FIG. 3A, which complies with the optimum value R10. For instance, in the conventional sidewall process, sizes of line and space of the resist pattern are set to about 70 nm and 70 nm, whereas in the present embodiment, sizes of line and space of the resist pattern 11 are set to about 75 nm and 75 nm. Moreover, a processing transformation difference in the process of transforming the resist pattern 11 into the hardmask pattern 12b is set to become a difference value D12, as shown in FIG. 3B, which complies with the optimum value R10. Furthermore, an amount of sliming with respect to the hardmask pattern 12b is set to the size R12, as shown in FIG. 3C, which complies with the optimum value R10. For example, in a case where sizes of line and space of the final pattern 13 are set to about 35 nm and 35 nm, the amount of slimming with respect to the hardmask pattern 12b will be set to about 20 nm, whereas in the conventional sidewall process, the amount of slimming with respect to the hardmask pattern will be set to about 35 nm. Moreover, a pattern size of the sidewall pattern 14 is set to the size R14, as shown in FIG. 3D, which complies with the optimum value R10. For example, in the conventional sidewall process, the pattern size of the sidewall pattern will be set to about 35 nm which is the same size as the pattern size of the final pattern 13, whereas in the present embodiment, the pattern size of the sidewall pattern 14 will be set to about 30 nm. Furthermore, a pattern size of the sidewall pattern 14 after having the hardmask pattern 12 removed is set to the size R14a, as shown in FIG. 3E, which complies with the optimum value R10. Then, a processing transformation difference in the process of transforming the sidewall pattern 14 into the final pattern 13 is set to a difference value D13, as shown in FIG. 3F, which complies with the optimum value R10. For example, in the conventional sidewall process, the processing transformation difference in the process of transforming the sidewall pattern into the final pattern will be set to become '0', whereas in the present embodiment, the processing transformation difference in the process of transforming the sidewall pattern 14 into the final pattern 13 will be set to be about 5 nm.

Then the size setting device 1 outputs the finished pattern sizes of the respective patterns having been set by the arithmetic section 4 through the output section 6 (step S24), after which the finished pattern setting process is completed, and the operation returns to the processing steps, shown in FIG. 1, in the method of manufacturing a semiconductor device. In the present embodiment, a semiconductor device is manufactured by performing the circuit pattern forming process (step S4) with which each pattern is actually formed in such a way that a finished pattern size becomes the one as set by the finished pattern setting process. That is, in the first to fifth pattern transformation steps, the respective patterns are formed in such a way that finished pattern sizes become the ones that are set by the finished pattern setting process.

In this way, according to the present embodiment, the pattern formation conditions and the finished pattern sizes for the patterns to be formed in the respective pattern transformation steps are set such that the total amount of in-plane size variation will become small, on the basis of which the respective patterns are actually formed to have the set finished pattern sizes. Accordingly, it is possible to manufacture a semiconductor device while reducing possible in-plane size variation in the pattern eventually formed in the process target layer. Therefore, according to the present embodiment, possible in-plane variations with respect to a space size and a line size in each of the patterns can be reduced appropriately, whereby a semiconductor device which is capable of preventing; slowdown in circuit speed due to increase in inter-wire capacitance, operation malfunction due to short channel which could be caused in a transistor, and slowdown in circuit speed due to long channel which could be caused in the transistor, can be manufactured.

The present embodiment has been described while referring to the case of the sidewall process in which the hardmask pattern 12 is removed, and then the target process layer 13a is processed into the final pattern 13 while using the remaining sidewall pattern 14 as the mask. However, the present embodiment is obviously not limited to such case, while it is also possible to adopt such sidewall process in which the sidewall pattern 14 is removed, and then the target process layer 13a is processed into the final pattern 13 while using the remaining hardmask pattern 12 and a second hard mask pattern 215, having been deposited before the removal of the sidewall pattern 14, as the mask. Moreover, instead of slimming the hardmask patter 12, it is possible to have the resist pattern 11 slimmed prior to the step of processing the hardmask pattern 12.

Next, this case of the sidewall process in which the sidewall pattern 14 is removed, and then the target process layer 13a is processed into the final pattern 13 while using the remaining hardmask pattern 12 and the second hard mask pattern 215, having been deposited before the removal of the sidewall pattern 14, as the mask, will be described.

Figure 8A:
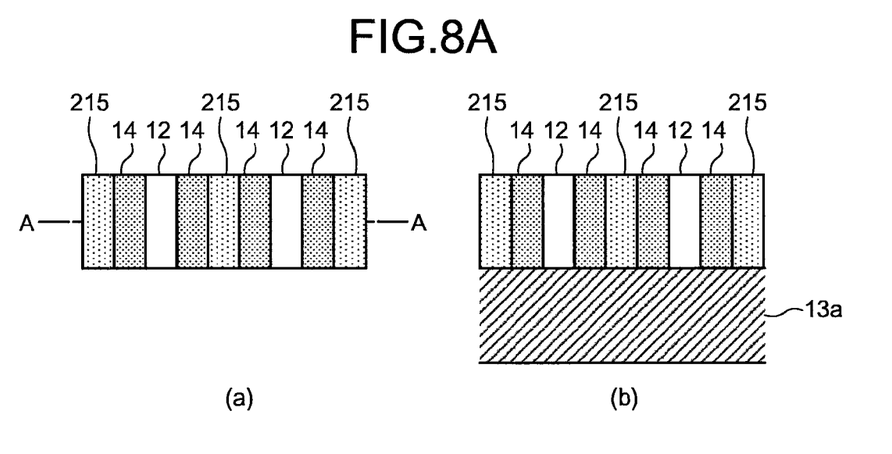
FIG. 8A illustrates a schematic plane view and a schematic sectional view (Phase 1) showing another example of pattern transformation steps as performed in a circuit pattern formation step.
Figure 8B:
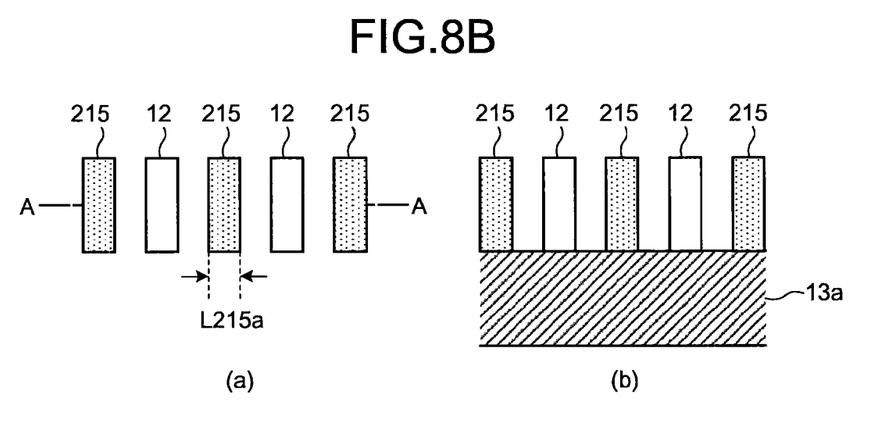
FIG. 8B illustrates a schematic plane view and a schematic sectional view (Phase 2) showing another example of the pattern transformation steps as performed in the circuit pattern formation step.
Figure 8C:
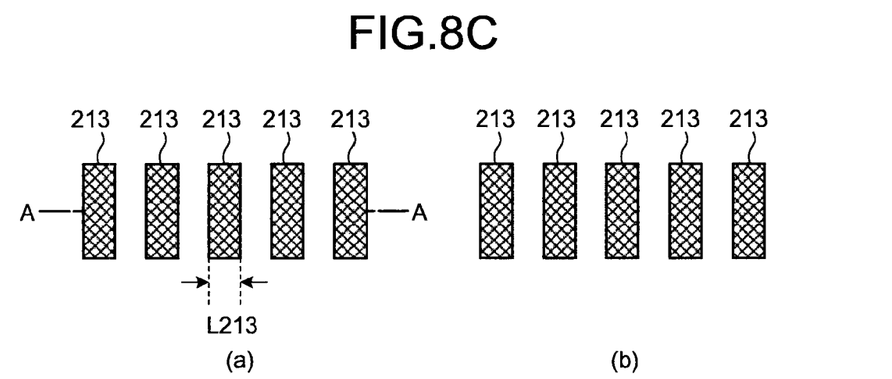
FIG. 8C illustrates a schematic plane view and a schematic sectional view (Phase 3) showing another example of the pattern transformation steps as performed in the circuit pattern formation step.

In the sidewall process, first, a hardmask layer (a first sacrifice film) to be functioning as a sacrifice film is formed on a process target layer, which is to be eventually formed into a final target pattern, after which a resist solution is applied on the hardmask layer. Then, the first to fourth pattern transformation steps which are the same as the ones shown in FIG. 2A to FIG. 2D are performed. After that, a film which is to be processed into a second hardmask is formed on the entire surface of the hardmask 12 and the sidewall pattern 14, and on the process target layer 13a. The film which is to be processed into the second hardmask can be formed with a material that can keep a sufficient etching selectivity with the sidewall pattern 14. Then, the film, which is to be processed into the second hardmask has a part of it above the hardmask 12 and the sidewall pattern 14 removed using a CMP (chemical and mechanical polishing) process so that the film between the sidewall patterns 14 remains. By this process, the second hardmask 215 is formed between the sidewall patterns 14 as shown in FIG. 8A. Next, as shown in FIG. 8B, the sidewall patterns 14 are removed, whereas the hardmask 12 and the second hardmask 215 with a pattern size L215a remain on the process target layer 13a. After that, the process target layer 13a is selectively etched using the remaining hardmask 12 and the second hardmask 215 as masks. Thus, the fifth pattern transformation step for forming the process target layer 13a into a final pattern 213 is performed, whereby the final target pattern 13 with a pattern size L213 is formed as shown in FIG. 8C. In each of FIG. 8A to FIG. 8C, patterns formed in a peripheral cell region are shown.

In the above described sidewall process, the arithmetic section 4 obtains a total amount of possible in-plane size variation from the whole pattern transformation steps through performing a simulation process, or the like, based on a possible amount of in-plane size variation of the pattern as formed in each of the pattern transformation steps in a case when the pattern formation conditions shown in FIG. 9A to FIG. 9F for each of the pattern transformation steps are changed. Moreover, the arithmetic section 4 sets the finished pattern size for each pattern to be formed in each pattern transformation step based on the obtained total amount of possible in-plane size variation so that the amount of the in-plane size variation of the final pattern 13 finally formed in the process target layer 13a will become smaller.

Figure 9A:
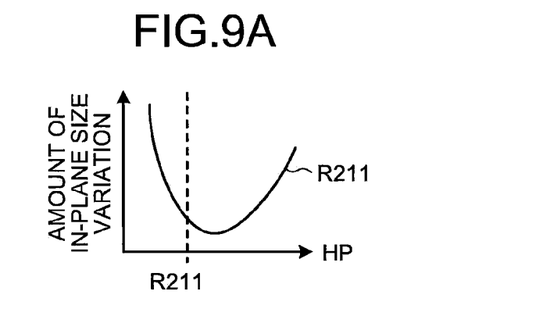
FIG. 9A is a diagram showing an amount of in-plane size variation (Version 1) when a size of each pattern formed in each of the pattern transformation steps shown by FIG. 8A to FIG. 8C is changed.
Figure 9B:
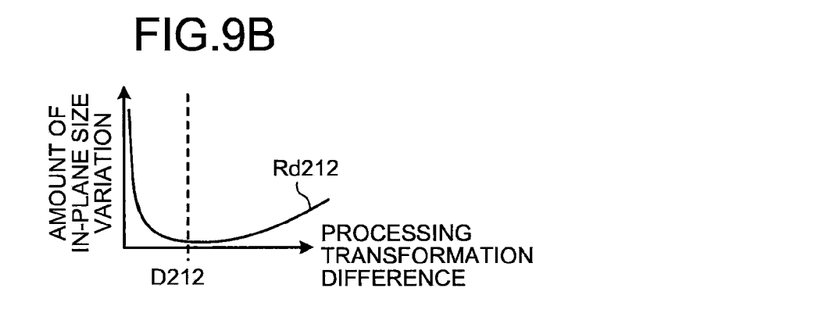
FIG. 9B is a diagram showing an amount of in-plane size variation (Version 2) when a size of each pattern formed in each of the pattern transformation steps shown by FIG. 8A to FIG. 8C is changed.
Figure 9C:
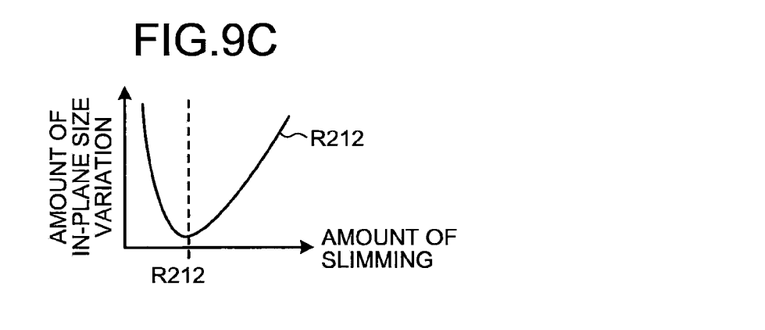
FIG. 9C is a diagram showing an amount of in-plane size variation (Version 3) when a size of each pattern formed in each of the pattern transformation steps shown by FIG. 8A to FIG. 8C is changed.
Figure 9D:
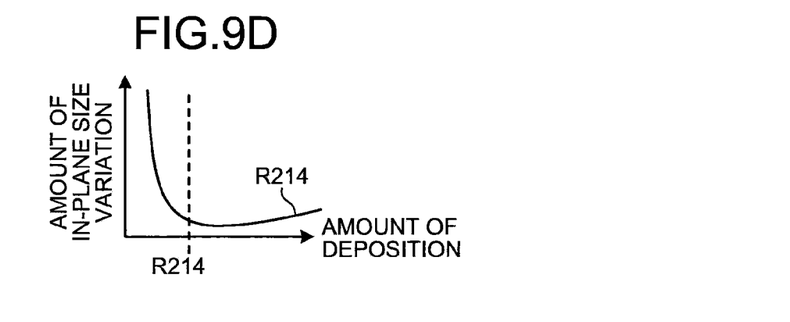
FIG. 9D is a diagram showing an amount of in-plane size variation (Version 4) when a size of each pattern formed in each of the pattern transformation steps shown by FIG. 8A to FIG. 8C is changed.
Figure 9E:
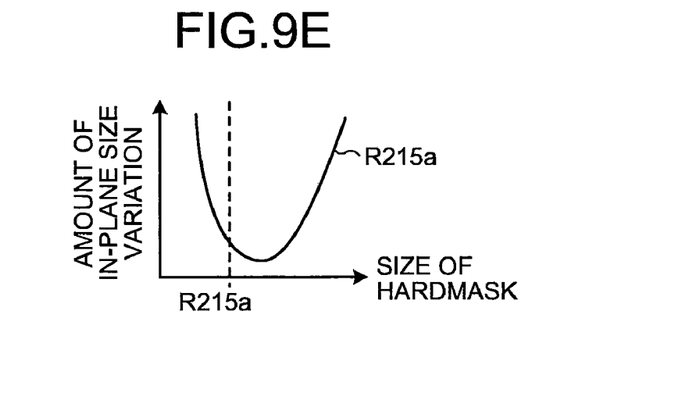
FIG. 9E is a diagram showing an amount of in-plane size variation (Version 5) when a size of each pattern formed in each of the pattern transformation steps shown by FIG. 8A to FIG. 8C is changed.
Figure 9F:
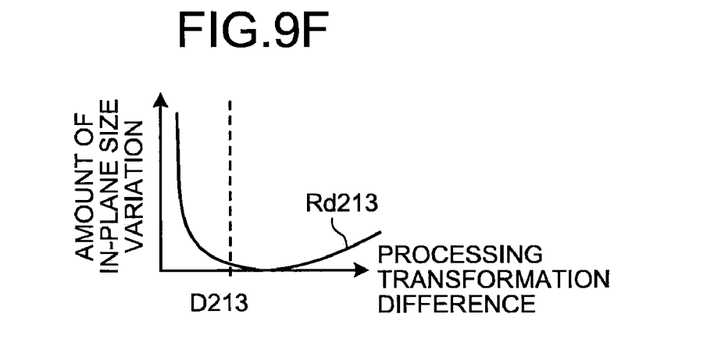
FIG. 9F is a diagram showing an amount of in-plane size variation (Version 6) when a size of each pattern formed in each of the pattern transformation steps shown by FIG. 8A to FIG. 8C is changed.
Figure 9G:
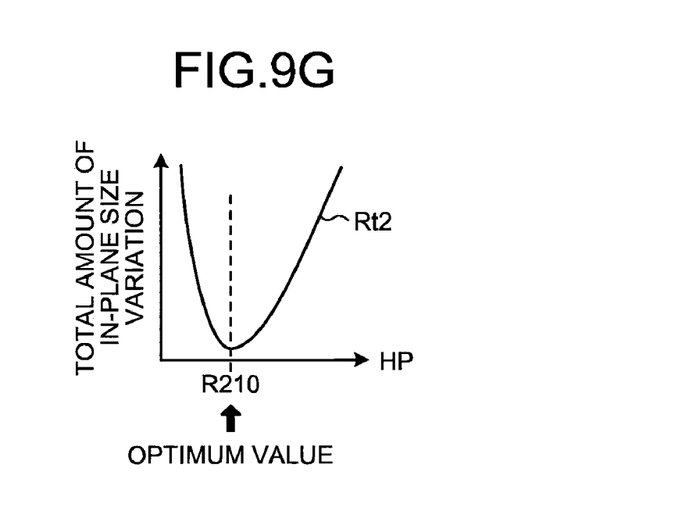
FIG. 9G is a diagram showing an amount of in-plane size variation (Version 7) when a size of each pattern formed in each of the pattern transformation steps shown by FIG. 8A to FIG. 8C is changed.

The arithmetic section 4 cumulates the respective amounts of in-plane size variation as illustrated by the curves R211, Rd212, R212, R214, R215a and Rd213 shown in FIG. 9A to FIG. 9F while sequentially correlating the curves R211, Rd212, R212, R214, R215a and Rd213, in order to obtain the possible distribution of the total amount of in-plane size variation (hereinafter to be referred to simply as total amount) with respect to the entire pattern transformation steps as shown by a curve Rt2 in FIG. 9G. Then, the arithmetic section 4 obtains an acceptable range of in-plane size variation with which an acceptable range of pattern size and a desired yield ratio set based on a lithography margin can be achieved, after which the arithmetic section 4 calculates a total amount of in-plane size variation with respect to each of the pattern formation conditions fulfilling the formulas (1) to (3). Then, from among the respective total amount of in-plane size variation derived, the arithmetic section 4 obtains the one with the smallest value as an optimum value R210 for the total amount of in-plane size variation.

Next, the arithmetic section 4 sets a finished pattern size for each of the pattern transformation steps so that the value for the total amount of in-plane size variation is adjusted to the optimum value R210. As shown by the curve R211 in FIG. 9A, the arithmetic section 4 sets a finished pattern size of the resist pattern 11 formed in the first pattern transformation step to a pattern size R211 which complies with the optimum value R210. Moreover, as shown in FIG. 9B, the arithmetic section 4 sets a processing transformation difference in the process of transforming the resist pattern 11 into the hardmask pattern 12b to a difference value D212 which complies with the optimum value R210. Furthermore, the arithmetic section 4 sets an amount of slimming to the pattern size R212, as shown in FIG. 9C, which complies with the optimum value R210, and the pattern size of the sidewall pattern 14 to the pattern size R214, as shown in FIG. 9D, which complies with the optimum value R210. After that, the arithmetic section 4 sets a pattern size of the second hardmask pattern 215 without the sidewall pattern 14 to the pattern size 215a, as shown in FIG. 9E, which complies with the optimum value R210, and a processing transformation difference in the process of transforming the hardmask pattern 12 and the second hardmask pattern 215 into the final pattern 213 to a difference value D213 which complies with the optimum value R210.

Then, by performing the circuit pattern forming process (step S4) using the sidewall process with which each pattern is actually formed in such a way that a finished pattern size becomes the one as set by the arithmetic section 4, a semiconductor device is manufactured.

In this way, in the case when the final pattern 213 is formed using the hardmask pattern 12 and the second hardmask pattern 215 as masks, the pattern formation conditions and the finished pattern sizes for the patterns to be formed in the respective pattern transformation steps are set such that the total amount of in-plane size variation will become small, on the basis of which the respective patterns are actually formed to have the set finished pattern sizes. Accordingly, it is possible to manufacture a semiconductor device while reducing possible in-plane size variation in the pattern eventually formed in the process target layer.

Moreover, although the present embodiment has been described as the case in that the possible total amount of in-plane size variation in through out the first to fifth pattern transformation steps in the sidewall process is obtained, and the finished pattern sizes for the patterns to be actually formed in the respective first to fifth pattern transformation steps are set based on the obtained total amount of in-plane size variation, the present embodiment is not limited to such case. For example, it is possible to obtain possible amounts of in-plane size variation with respect to the patterns to be formed in at least two consecutive pattern transformation steps among the first to fifth pattern transformation steps, and based on that obtained results, obtain a possible total amount of in-plane size variation with respect to the two consecutive pattern transformation steps in order to set the finished pattern sizes for the patterns to be actually formed in the two pattern transformation steps based on that obtained total amount of in-plane size variation. In this case also, as compared with the conventional method of manufacturing a semiconductor device, it is possible to manufacture a semiconductor device while reducing possible in-plane size variation in the pattern eventually formed in the process target layer.

Furthermore, according to the present embodiment, the pattern formation conditions and the finished pattern sizes for the patterns to be formed in the respective pattern transformation steps are set such that the total amount of in-plane size variation in through out the whole pattern transformation steps becomes small. However, the present embodiment is not limited to such case. For example, it is possible to focus on a possible in-plane size variation with respect to the pattern to be finally formed in stead of focusing on the possible total amount of in-plane size variation in through out the whole pattern transformation steps, and arrange such that a pattern size of the final pattern to be formed will have a possible minimum amount of in-plane size variation. In this way, even with the case of setting the pattern size of the final pattern, it is possible to achieve less amount of in-plane size variation than in the conventional case. In this case, it is desirable that a correlation between a possible amount of in-plane size variation of a pattern to be formed in a predetermined pattern transformation step and a possible amount of in-plane size variation of a pattern as well as pattern formation conditions in a subsequent pattern transformation step is acquired in advance thorough simulations or experiments.

Furthermore, in the case of setting the pattern size of the final pattern, the arithmetic section 4 as included in the above-described size setting apparatus 1 obtains, based on the possible amount of in-plane size variation of the pattern to be formed in the predetermined pattern transformation step and the pattern formation conditions in the subsequent pattern transformation step, the possible amount of in-plane size variation of the pattern to be formed in the subsequent pattern transformation step. By repeating such series of calculations with respect to each pattern transformation step, it is possible to derive a possible amount of in-plane size variation with respect to the final pattern to be formed as a result that includes influence of a possible amount of in-plane size variation of a pattern to be formed in a preceding pattern transformation step. Accordingly, in this case, only the possible amount of in-plane size variation with respect to the final pattern to be formed may be focused in order to set such pattern size of the final pattern that allows a possible minimum amount of in-plane size variation. Moreover, the arithmetic section 4 may obtain the pattern formation conditions in the preceding pattern transformation step according to the set pattern size of the final pattern.

Meanwhile, the arithmetic section 4 can obtain the information on the correlation among the amounts of in-plane size variation in the respective pattern transformation steps by referring to the above-mentioned relationship formulas representing the correlation among the respective pattern transformation steps as being previously stored in the database 5, or by referring to a correlation table that shows the above-mentioned correlation. Or else, the arithmetic section 4 can obtain the information on the correlation among the amounts of in-plane size variation in the respective pattern transformation steps through performing a predetermined simulation process.

Furthermore, the size setting apparatus 1 according to the present embodiment can be achieved in a form of a computer readable program which is being arranged previously and executed in a computer system such as a personal computer, a work station, or the like. Such computer system will be able to perform the process operation of the size setting apparatus 1 as shown in FIG. 5 by reading out and executing the program recorded in a predetermined storage medium. Here, possible options for the predetermined storage medium include all kinds of storage media which are capable of recording a computer readable program, and the possible options are: a portable storage medium such as a flexible disk (FD), a CD-ROM, a MO disk, a DVD disk, a magnetic optical disk, an IC card, etc.; a storage medium provided inside/outside a computer system such as a hard disk drive (HDD), a cash memory, a RAM, etc.; a communication medium which holds a program for a short period of time at program transmission; and so forth. Moreover, such computer system may perform the process operation of the size setting apparatus 1 by first acquiring the program from another computer system connected through a network and then executing the program.

As described above, according to the present embodiment, it is possible to achieve a method of manufacturing a semiconductor device, and a pattern size setting program which are capable of holding down the occurrence of in-plane size variation in the pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   calculating an amount of in-plane size variation after pattern transformation step, wherein the amount of in-plane size variation is calculated for each one of a plurality of pattern transformation steps in forming a final pattern on a predetermined layer by performing the plurality of pattern transformation steps;
   calculating a total amount of in-plane size variation of that calculated for each one of the plurality of pattern transformation steps;
   setting a finished pattern size of the final pattern based on the total amount of in-plane size variation; and
   setting a finished pattern size for each one of the plurality of pattern transformation steps based on the finished pattern size of the final pattern.

2. The method of manufacturing a semiconductor device according to claim 1, wherein
   the plurality of pattern transformation steps include
   a pattern transformation process of forming a resist pattern by transforming a mask pattern to a resist film, which is applied on a first material film formed on a process target film, using a lithography process,
   a pattern transformation process of forming the first material film into a first pattern by processing the first material film using the resist pattern as a mask,
   a pattern transformation process of forming the first pattern into a second pattern by slimming the first pattern,
   a pattern transformation process of forming a sidewall pattern which is made from a second material film on a side of the second pattern, and
   a pattern transformation process of forming a pattern by removing the second pattern or the sidewall pattern and processing the process target layer using the remaining second pattern or sidewall pattern as a mask.

3. The method of manufacturing a semiconductor device according to claim 2, wherein
   the pattern after pattern transformation that is formed by the plurality of pattern transformation steps is formed under pattern formation conditions which are respectively set with respect to the plurality of pattern transformation steps, and
   the pattern formation conditions include at least one of a size of resist pattern, a processing transformation difference in processing the first material film into the first pattern, an amount of slimming for processing the first pattern into the second pattern, an amount of deposition or a size of sidewall pattern, and a processing transformation difference in forming the pattern by processing the process target layer.

4. The method of manufacturing a semiconductor device according to claim 1, wherein the pattern after pattern transformation that is formed by the plurality of pattern transformation steps is formed under pattern formation conditions which are respectively set with respect to the plurality of pattern transformation steps; and the total amount of in-plane size variation is obtained based on a relation between the pattern formation conditions in each of the plurality of pattern transformation steps and in-plane size variation amount after pattern transformation of each pattern formed under the pattern formation conditions in each of the consecutive two pattern transformation steps.

5. The method of manufacturing a semiconductor device according to claim 4, wherein the plurality of pattern transformation steps include a pattern transformation process of forming a resist pattern by transforming a mask pattern to a resist film, which is applied on a first material film formed on a process target film, using a lithography process, a pattern transformation process of forming the first material film into a first pattern by processing the first material film using the resist pattern as a mask, a pattern transformation process of forming the first pattern into a second pattern by slimming the first pattern, a pattern transformation process of forming a sidewall pattern which is made from a second material film on a side of the second pattern, and a pattern transformation process of forming a pattern by removing the second pattern or the sidewall pattern and processing the process target layer using the remaining second pattern or sidewall pattern as a mask.

6. The method of manufacturing a semiconductor device according to claim 5, wherein the pattern formation conditions include at least one of a size of resist pattern, a processing transformation difference in processing the first material film into the first pattern, an amount of slimming for processing the first pattern into the second pattern, an amount of deposition or a size of sidewall pattern, and a processing transformation difference in forming the pattern by processing the process target layer.

* * * * *